(12) United States Patent
Miura

(10) Patent No.: US 6,811,420 B2
(45) Date of Patent: Nov. 2, 2004

(54) CONTACT PIN AND SOCKET FOR ELECTRICAL PARTS

(75) Inventor: Akira Miura, Kawaguchi (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 10/151,000

(22) Filed: May 21, 2002

(65) Prior Publication Data

US 2002/0177343 A1 Nov. 28, 2002

(30) Foreign Application Priority Data

May 22, 2001 (JP) .......................... 2001-152926
May 28, 2001 (JP) .......................... 2001-158525

(51) Int. Cl.$^7$ .............................................. H01R 11/22
(52) U.S. Cl. ...................... 439/266; 439/862; 439/330
(58) Field of Search ............................... 439/266, 862, 439/330, 72, 525, 526, 816; 438/754, 687; 29/874, 876, 884; 264/341

(56) References Cited

U.S. PATENT DOCUMENTS

| | | | | |
|---|---|---|---|---|
| 3,905,907 A | * | 9/1975 | Shiga ........................ | 252/79.4 |
| 4,551,292 A | * | 11/1985 | Fletcher et al. ............. | 264/139 |
| 5,443,396 A | * | 8/1995 | Tokushige ................... | 439/266 |
| 5,713,751 A | * | 2/1998 | Fukunaga .................... | 439/266 |
| 5,864,946 A | * | 2/1999 | Eldridge et al. .............. | 29/843 |
| 5,908,324 A | * | 6/1999 | Ohshima et al. ............ | 439/266 |
| 5,936,418 A | * | 8/1999 | Ideta et al. .................. | 324/755 |
| 6,019,671 A | * | 2/2000 | Shendon ..................... | 451/288 |
| 6,213,803 B1 | * | 4/2001 | Kato et al. ................... | 439/266 |

* cited by examiner

Primary Examiner—P. Austin Bradley
Assistant Examiner—Edwin A. Leon
(74) Attorney, Agent, or Firm—Staas & Halsey LLP

(57) ABSTRACT

A contact pin for an IC socket. The contact pin is formed from a metal material having conductivity and includes an elastic portion that is elastically deformable by a force applied thereto. A contact portion is formed at an end portion of the elastic portion and contacts an IC lead of an IC package. The elastic portion is polished to improve durability.

24 Claims, 5 Drawing Sheets

CONTACT PIN AND SOCKET FOR ELECTRICAL PARTS

BACKGROUND OF THE INVENTION

1. Field of the Invention

The present invention relates to a contact pin utilized for a socket for electrical parts for detachably accommodating and holding an electrical part such as a semiconductor device (called as "IC package" hereinlater), and also related to a socket for electrical parts provided with such contact pin.

2. Related Art of the Invention

In a known art, there has been provided an IC socket, as "socket for electrical parts" mentioned above, for carrying out performance test of an IC package as "electrical part", which is preliminarily disposed on a printed circuit board and in which an IC package is accommodated in this IC socket to thereby establish an electrical connection between the IC package and the printed circuit board.

As such IC package, there is provided one having, for example, a rectangular body having a side portion from which a number of terminals extend sideways.

Under the state that the IC package is accommodated in the IC socket, when contact portions of contact pins of the IC socket contact to a number of terminals of the IC package, respectively, the terminals and the printed circuit board are electrically connected through the contact pins.

Such contact pin is formed by being punched out from a metal thin plate having conductivity, by means of press working, so as to have an elastic portion, which is elastically deformed by being pressed by an operation member which is vertically movable and a contact portion formed to a front (top) end side of the elastic portion and adapted to contact the terminal of the IC package.

When the IC package is accommodated in the IC socket, the operation member is lowered. The operation member is formed with a cam portion which presses a contact piece of the contact pin to thereby elastically deform the elastic portion and retire the contact portion of the contact pin from an insertion range of the terminal of the IC package.

Under the state mentioned above, the IC package is accommodated in an accommodation portion of an IC socket body, and thereafter, the operation member is moved upward. According to this upward movement, the contact portion of the contact pin returns to its initial position by the elastic force of the elastic portion thereof, and the contact portion is then contacted to an upper surface of the terminal of the IC package to thereby establish the electrical connection therebetween.

However, in the known structure mentioned above, there may cause a case that a rough or course cut surface may be provided at the time of punching out the contact pin from the metal thin plate, and, in such case, according to the repeated operation of accommodation or removal of the IC package, the elastic portion of the contact pin may be loaded repeatedly and a stress is concentrated on a corner portion thereof by the coarse surface of the elastic portion, thus facilitating fatigue and making worse its durability.

SUMMARY OF THE INVENTION

An object of the present invention is to substantially eliminate defects or drawbacks encountered in the prior art mentioned above and to provide a contact pin used for a socket for electrical parts having an improved structure of an elastic portion of the contact pin and also provide a socket for electrical parts having such improved contact pin.

This and other objects can be achieved according to the present invention by providing, in one aspect, a contact pin for an electrical part formed from a metal material having conductivity, comprising:

an elastic portion elastically deformable; and a contact portion formed to a tip end portion of the elastic portion and adapted to contact a terminal of an electrical part, wherein the elastic portion is polished by polishing means.

According to this aspect, the elastic portion of the contact pin is formed to have a smooth surface by the polishing means, so that a load is not concentrated at a specific portion even if the load is repeatedly applied, and hence, the durability of the contact pin can be improved.

In a preferred embodiment of this aspect, the polishing is performed, such as chemical polishing, without applying any external force. A nickel plating may be effected to the elastic portion to which the chemical polishing has been made.

The elastic portion is formed to provide a curved shape.

According to the preferred embodiment mentioned above, the contact pin even being small in size and weak in strength can be polished, by such as chemical polishing, by applying no external mechanical force. According to the chemical polishing treatment, a number of contact pins can be polished at the same time by, for example, dipping them in a polishing solution, thus improving the workability for manufacturing the contact pins. The nickel plating will compensate the reduction in thickness of the contact pin including the elastic portion through the polishing treatment and, hence, the elastic strength of the elastic portion will be maintained.

In a modified aspect of the present invention in the above aspect, there is provided a contact pin for a socket for an electrical part formed from a conductive material, comprising:

a base portion;

a stationary piece extending from the base portion and contacting the electrical part; and a movable piece extending from the base portion and contacting the electrical part, wherein the movable piece comprises an elastic portion and a movable contact portion contacting the electrical part and the elastic portion is polished.

In this aspect, the chemical polishing treatment will be preferably applied. The chemical polishing is effected so that the movable contact portion has a surface roughness of a value less than a predetermined value.

In another aspect, the contact pin of the present invention is applied to a socket for an electrical part, and the socket for an electrical part having a terminal comprising:

a socket body to which an electrical part is mounted;

an operation member provided for the socket body to be vertically movable in an operative state, the operation member being formed with a cam portion;

a contact pin provided for the socket body, the contact pin formed from a metal material having a conductivity and comprising an elastic portion elastically deformable, a contact portion formed to a tip end portion of the elastic portion and adapted to contact the terminal of an electrical part, and an operation piece to be pressed by the cam portion of the operation member, wherein the elastic portion is polished by polishing means, and the elastic portion is elastically deformed when the operation member is moved downward and the operation piece of the contact pin is pressed by the cam portion of the operation member to thereby separate the movable contact portion from the terminal of the electrical part.

The socket is an IC socket provided with a number of contact pins and the electrical part is an IC package provided with a number of IC leads as the terminals.

The nature and further characteristic features of the present invention will be made more clear from the following descriptions made with reference to the accompanying drawings.

DESCRIPTION OF THE PREFERRED EMBODIMENT

A preferred embodiment of the present invention will be described hereunder with reference to the accompanying drawings of FIGS. 1 to 5.

Figure 1:
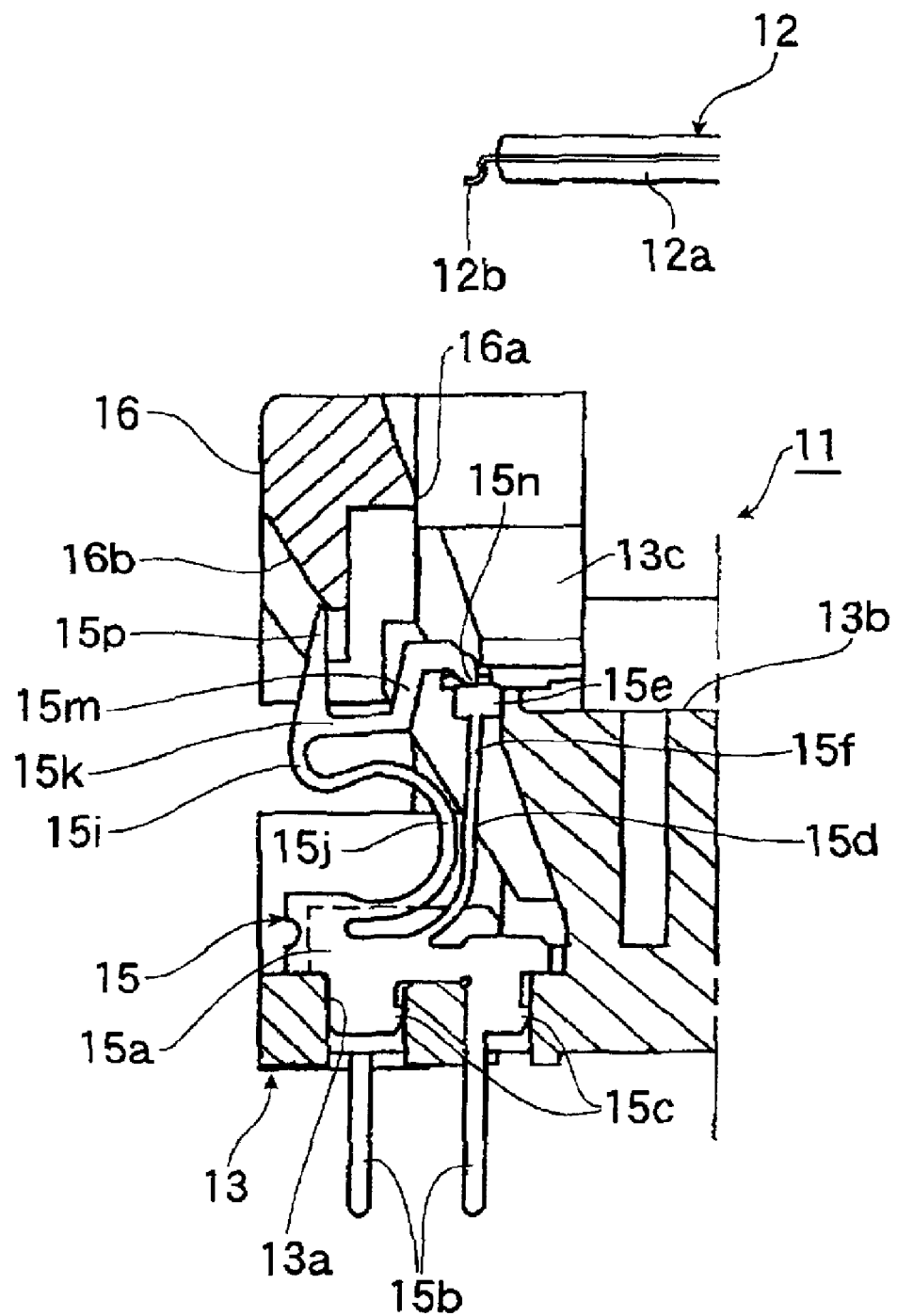
FIG. 1 is a sectional view of an IC socket provided with a contact pin according to an embodiment of the present invention and showing a state that a movable piece of the contact pin is closed.

With reference to FIG. 1, an IC socket as "a socket for electrical parts" is totally designated by reference numeral 11, and the IC socket 11 is utilized for electrical connection between an IC lead 12b as "a terminal" for an IC package 12 as "an electrical part" and a printed circuit board (not shown) of a tester, in order to carry out a performance test of the IC package 12.

The IC package 12 is, as shown in FIG. 1, so-called a gull-wing-type, having a structure in which a number of IC leads 12b project sideways from a rectangular package body 12a of the IC package 12.

On the other hand, the IC socket 11 generally has a socket body 13 to be mounted on a printed circuit board, not shown, and the socket body 13 is formed with a number of contact pins 15 which are elastically deformable and connected to be electrically conductive to the IC leads 12b. The socket body 13 is also provided with an operation member 16 having a rectangular frame structure to be vertically movable so as to elastically deform the contact pins 15.

The socket body 13 is formed with press-in holes 13a into which the contact pins 15 are pressed and formed, at its upper surface, with an accommodation portion 13b in which the IC package 12 is mounted and accommodated. Furthermore, guide portions 13c are also formed to portions of the accommodation portion 13b, corresponding to corner portions of the IC package body 12a, for positioning the IC package 12 to a predetermined position.

Further, it is to be noted that term such as "upper (upward)", "lower (downward)", and the like are used herein with reference to the illustration of figures or in a general usable state of the socket.

The contact pin 15 has a springy property and is formed from a metal material having an excellent electrical conductivity. The contact pin 15 is press-fitted into the press-in hole 13a of the socket body 13. A number of such contact pins 15 are arranged side by side.

Figure 2:
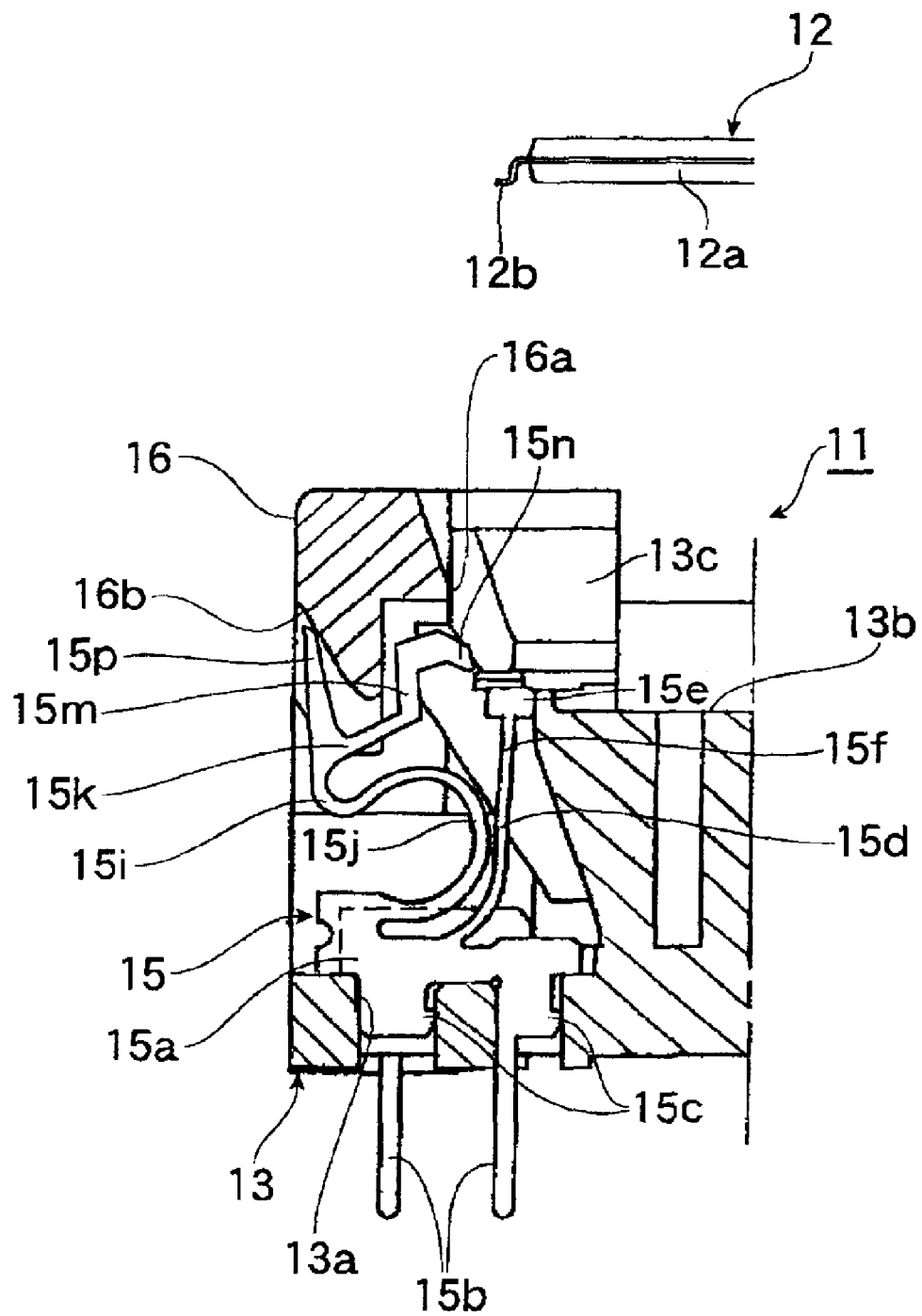
FIG. 2 is also a sectional view of the IC socket of FIG. 1 showing a state that the movable piece is opened.

More specifically, in the state illustrated in FIG. 1 or 2, each of the contact pins 15 has a base portion 15a from which a lead portion 15b extends downward, and the lead portion 15b has a root to which is formed a claw portion 15c which is press-contacted to an inner wall section of the press-in hole 13a of the socket body 13. The lead portion 15b has a part projecting downward from the socket body 13, which is then electrically connected to the printed circuit board.

Furthermore, a stationary contact piece 15d is formed to the upper portion of the base portion 15a so as to extend upward, and this stationary contact piece 15d is composed of an elastic portion 15f extending upward from the base portion 15a and a stationary contact portion 15e formed at the top end side of the elastic portion 15f so as to contact the lower surface side of the IC lead 12b.

Still furthermore, outside the stationary contact piece 15d (left side as viewed in FIG. 1), is disposed a movable contact piece 15i so as to extend upward. This movable contact piece 15i is composed of a curved elastic portion 15j, a movable piece 15k continuous to the curved elastic portion 15j and an arm portion 15m formed to the movable piece 15k so as to extend inward. The arm portion 15m has, at its front end portion, a movable contact portion 15n so as to contact the upper surface of the IC lead 12b. According to the structure mentioned above, the IC lead 12b of the IC package 12 is clamped from the upper and lower sides by the movable contact portion 15n and the stationary contact portion 15e. Further, the movable piece 15k is provided with an operation piece 15p so as to extend upward.

On the other hand, as shown in FIG. 1, the operation member 16 has an opening 16a of a size capable of the IC package 12 being inserted, and the IC package 12 inserted through this opening 16a is mounted on the accommodation portion 13b of the socket body 13. The operation member 16 is provided for the socket body 13 to be vertically movable and is urged upward by means of a spring, not shown.

Furthermore, the operation member 16 is formed with a cam portion 16b, which contacts the operation piece 15p of the contact pin 15 in a slidable manner. When the operation member 16 is lowered, the operation piece 15p is pressed by the cam portion 16b of the operation member 16 and the elastic portion 15j is then deformed elastically, and as shown in FIG. 2, the movable piece 15k is deformed in an obliquely outside upward to be opened. Accordingly, the movable contact portion 15n is moved so as to be separated from the IC lead 12b. Further, when the operation member 16 is moved upward, an operation reverse to that mentioned above will be performed. That is, the movable contact portion 15n is deformed obliquely downward by the elastic urging force of the elastic portion 15j and the IC lead 12b is clamped between the movable contact portion 15n and the stationary contact portion 15e to thereby establish an electrical connection therebetween. At this clamping operation, the movable contact portion 15n is slightly slid on the IC lead 12b.

In an actual arrangement, a number of contact pins 15, each having the structure mentioned above, are arranged. Each of the contact pins 15 is formed in the following manner.

That is, a thin metal plate of, for example, copper alloy, having an excellent conductivity is punched out to provide a predetermined shape through a press working. The thus punched out piece is chemically treated to be polished by polishing means so as to provide cut portions including the movable contact portion 15m and the elastic portion 15j having surface roughness L of a value less than that at the time of punching press working, for example, not more than 1 μm (see FIG. 5).

The contact pin 15 of the structure mentioned above will be manufactured or formed by the following method or process.

At first, a thin metal plate, as a metal material, of copper alloy is punched out, through the press working, into a predetermined shape and then is subjected to a chemical polishing.

The chemical polishing is performed by dipping the metal material into a mixed solution of a strong acid solution and a solution having a strong oxidation force to thereby provide gloss and smoothness to the surface of the metal material.

In the present invention, the punched-out copper alloy thin plate is dipped into a mixed solution consisting of sulfuric acid solution (100–200 g/l), hydrogen peroxide solution (30–70 g/l), as main component, and a saturated alcohol solution (small amount) at a solution temperature of 20–40° C. for 20 to 120 sec.

In other wards, in this chemical polishing treatment, it is necessary to set a condition of treatment to such that the surface roughness L of the surface of the movable contact portion 15n of the contact pin 15 is less than that at the punched-out process by the press working (for example, not more than 1 μm).

Thereafter, nickel plating, and then gold plating, are effected to the portion to which the chemical polishing was effected.

Further, such chemical polishing, by which any mechanical external force is not applied to the contact pin 15, makes it possible to polish even a small contact pin having a weak mechanical strength without deforming the same.

Furthermore, according to such chemical polishing treatment, a number of contact pins 15 can be dipped and polished at the same time, improving the workability in comparison with a mechanical polishing work by which the contact pins are to be polished one by one.

Still furthermore, when the contact pin 15 is polished, the thickness of the contact pin 15 including the elastic portion 15j is reduced. However, in the present invention, this thickness reduction is compensated by effecting the nickel plating to thereby ensure the elastic strength of the elastic portion 15j of the contact pin 15 and hence ensure the proper contacting pressure between the movable contact portion 15n and the IC lead 12b.

The IC socket 11 of the characters mentioned above will be used in the following manner.

At first, the lead portion 15b of the contact pin 15 of the IC socket 11 is preliminarily inserted into the insertion hole of the printed circuit board and then soldered, and in this condition, a plurality of such IC sockets 11 are arranged on the printed circuit board. Then, the IC package 12 is set by, for example, an automatic machine to thereby establish an electrically connection therebetween.

That is, the operation member 16 is depressed and lowered, with the IC package 12 being held, by the automatic machine against the urging force of both of the spring, not shown, and the contact pin 15. Then, as shown in FIG. 2, the operation piece 15p is pressed by the cam portion 16 of the operation member 16, the elastic portion 15j is then elastically deformed, the movable piece 15k is deformed obliquely upward and opened maximally, and the movable contact portion 15n is retired from the IC package insertion range.

Under this condition, the IC package 12 is released from the automatic machine and is mounted on the accommodation portion 13b of the socket body 13.

In this mounting operation, the IC package 12 is guided and positioned to the predetermined position by the guide portions 13c, and the IC lead 12b of the IC package 12 is surely placed on the upper surface 15q, as the contacting surface, of the stationary contact portion 15e of the contact pin 15.

Figure 3:
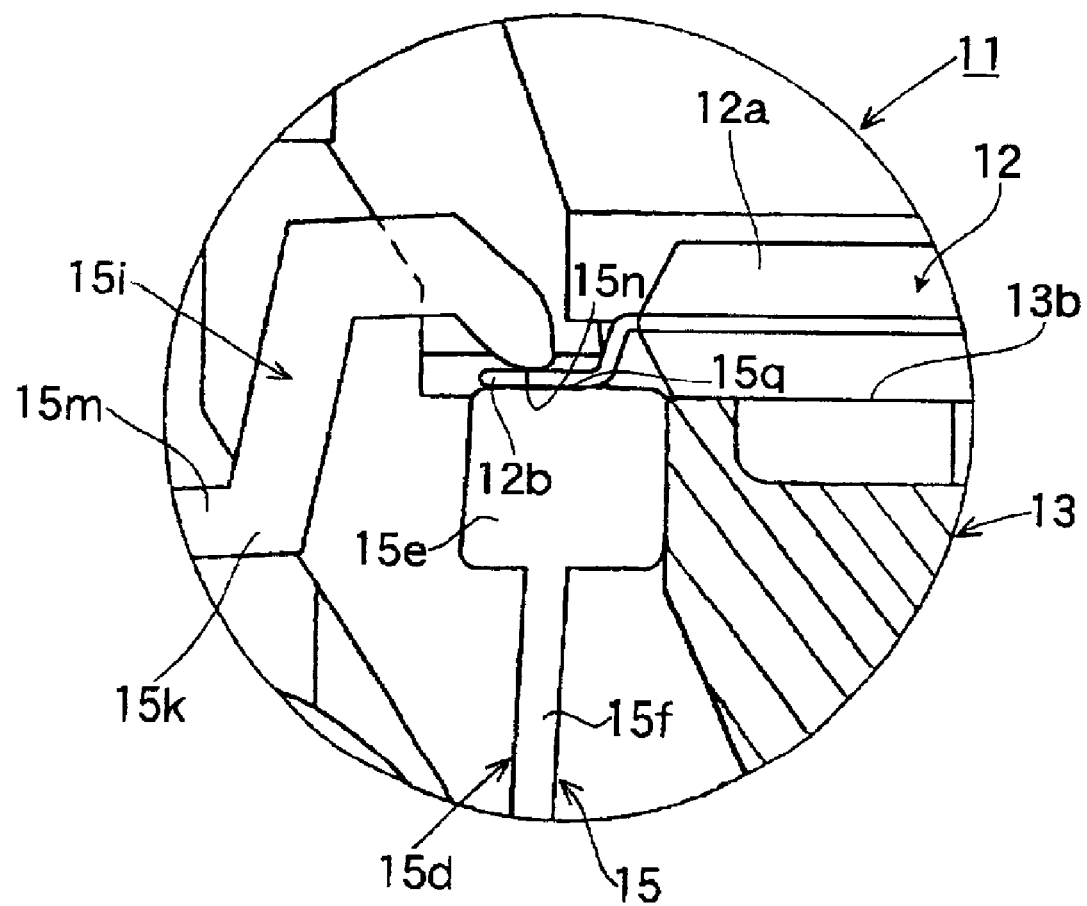
FIG. 3 is a sectional view, in an enlarged scale, of a portion the contact pin of FIG. 1 showing a state that an IC lead is clamped.
Figure 4:
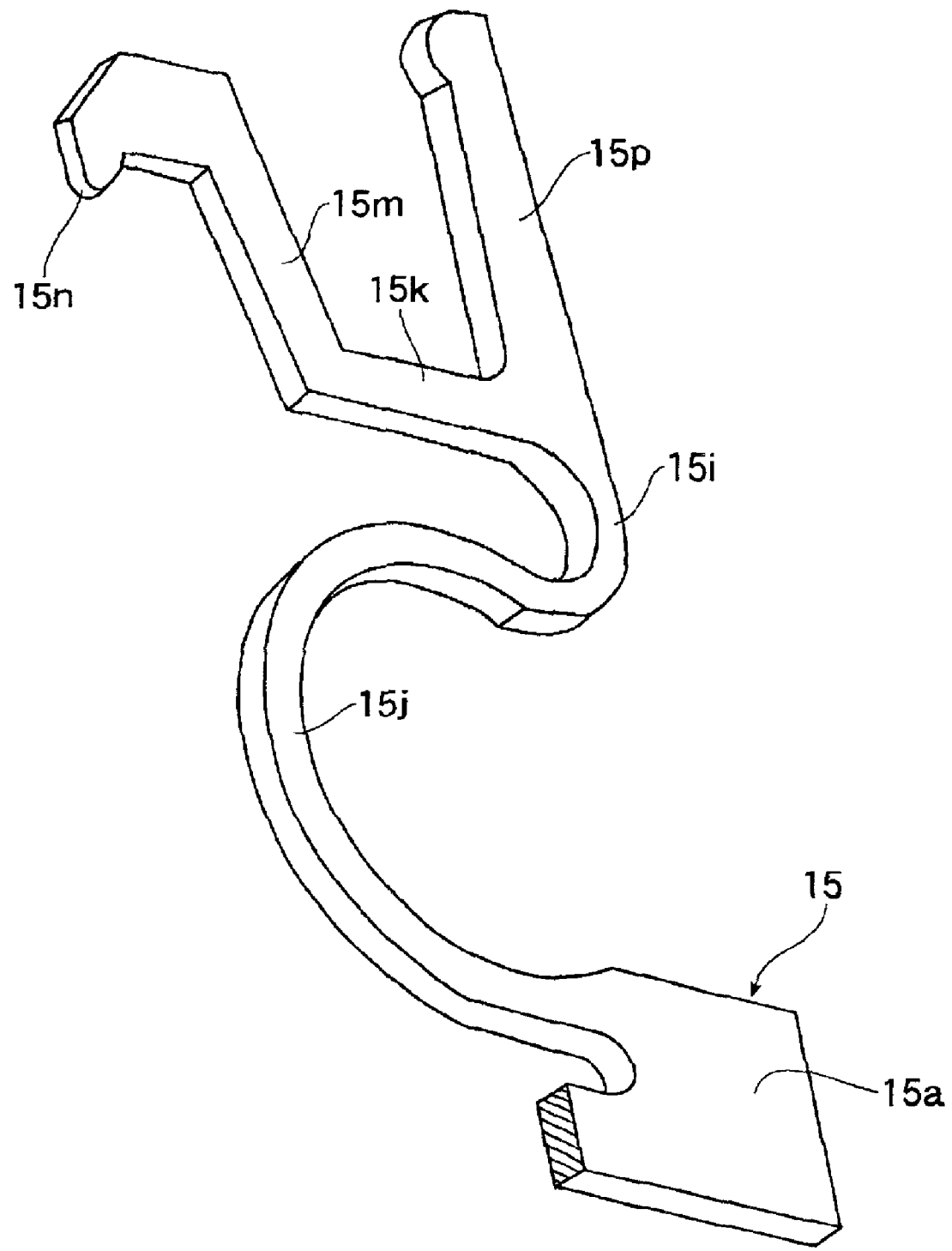
FIG. 4 is an enlarged perspective view of the movable piece of the contact pin of FIG. 1.

Thereafter, when the pressing force of the operation member 16 applied by the automatic machine is released, the operation member 16 is moved upward by the elastic force of the contact pin 15 and the urging force of the spring and the movable piece 15k of the contact pin 15 begins to return to its initial position. At a time when the operation member 16 has been moved upward to the predetermined position, the movable contact portion 15n of the contact pin 15 abuts against the upper surface of the predetermined IC lead 12b of the IC package 12 positioned in the manner mentioned above and, thereafter, wiped by a predetermined amount, whereby this IC lead 12b is clamped between the movable contact portion 15n and the stationary contact portion 15e to thereby establish the electrical connection therebetween as shown in FIG. 3.

As mentioned above, at a time of mounting or dismounting the IC package 12, the elastic portion 15j of the movable contact piece 15i of the contact pin 15 is elastically deformed repeatedly through the vertical movement of the operation member 16. According to this invention, however, the elastic portion 15j is chemically polished as mentioned above to provide a smooth flat surface thereof, so that, when a load is applied repeatedly to the elastic portion, the load is not concentrated to any specific portion, and thus, the durability in use thereof can be improved.

Further, it is to be noted that the present invention is not limited to the described embodiment and many other changes and modifications may be made without departing from the scopes of the appended claims.

For example, although, in the described embodiment, the present invention is applied to an IC socket as a socket for electrical parts, the present invention will be applied to other devices or like.

Figure 5:
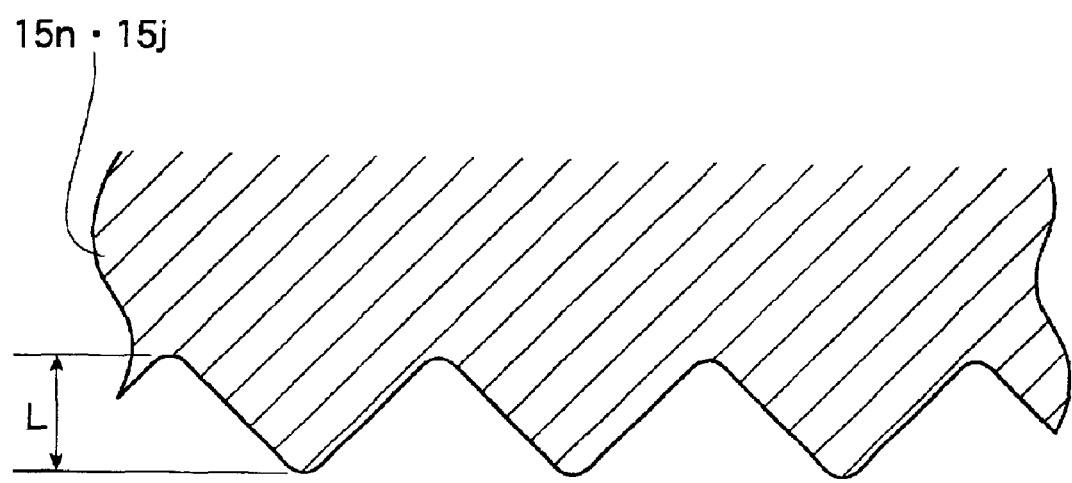
FIG. 5 is a view, in an enlarged scale, showing a surface roughness of the contact pin such as a portion of a movable contact portion thereof.

Moreover, although, in the described embodiment, the chemical polishing is utilized as polishing means, other polishing method or treatment such as electrolytic polishing, sand blasting, or shot peening may be utilized. Still furthermore, although, in the described embodiment, the contact pin 15 is entirely polished, only the elastic portion 15j thereof may be polished, and a polishing amount thereof may be less than that of the movable contact portion 15n so as to provide an R-shape, as shown in FIG. 5, with an acute angle portion of the surface of the punched material being removed.

Still furthermore, in the present embodiment, although the contact pin 15 is so-called a two-point type contact pin provided with the stationary contact piece 15d, one-contact type contact pin having only the movable contact piece may be equivalently utilized.

What is claimed is:

1. A contact pin for an electrical part formed from a metal material having conductivity, comprising:

an elastic portion elastically deformable; and a contact portion formed at a tip of an end portion of the elastic portion and contacting a terminal of the electrical part, the elastic portion being polished by a polisher to provide a predetermined surface roughness to the elastic portion to improve durability of the contact pin when a load is repeatedly applied to the elastic portion of the contact pin.

2. The contact pin according to claim 1, wherein the elastic portion has a curved shape.

3. The contact pin according to claim 1, wherein the contact pin is formed from the metal material by punching out a predetermined shape from a thin metal plate.

4. The contact pin according to claim 1, wherein the predetermined surface roughness is achieved by removing an acute angle portion of a surface of the elastic portion.

5. The contact pin according to claim 1, wherein the surface roughness is less than about 1 $\mu$m.

6. The contact pin according to claim 1, wherein the elastic portion is polished without application of an external force thereto.

7. The contact pin according to claim 6, wherein the polisher is a chemical polisher.

8. The contact pin according to claim 7, wherein a nickel plating is applied to the elastic portion polished by the chemical polisher.

9. The contact pin according to claim 8, wherein a gold plating is applied to the elastic portion after application of the nickel plating.

10. A contact pin for a socket for an electrical part formed from a metal material having conductivity, comprising:

a base portion;

a stationary piece extending from the base portion and contacting the electrical part; and a movable piece extending from the base portion and contacting the electrical part, the movable piece comprising an elastic portion and a movable contact portion contacting the electrical part, the elastic portion being polished by a polisher to provide a predetermined surface roughness to the elastic portion to improve durability of the contact pin when a load is repeatedly applied to the elastic portion.

11. The contact pin according to claim 10, wherein the contact pin is formed from the metal material by punching out a predetermined shape from a thin metal plate.

12. The contact pin according to claim 10, wherein the predetermined surface roughness is achieved by removing an acute angle portion of a surface of the elastic portion.

13. The contact pin according to claim 10, wherein the surface roughness is less than about 1 $\mu$m.

14. The contact pin according to claim 10, wherein the polisher is a chemical polisher.

15. The contact pin according to claim 14, wherein the chemical polisher is applied to the movable contact portion to provide a surface roughness less than a predetermined value.

16. The contact pin according to claim 10, wherein a nickel plating is applied to the polished elastic potion to increase thickness and elastic strength of the elastic portion.

17. The contact pin according to claim 16, wherein a gold plating is applied to the polished elastic portion after application of the nickel plating.

18. A socket for an electrical part having a terminal, comprising:

a socket body to which an electrical part is mounted;

an operation member vertically movable with respect to the socket body and having a cam portion; and a contact pin received by the socket body, the contact pin being formed from a metal material having conductivity and comprising an elastic portion elastically deformable, the elastic portion being polished by a polisher to provide a predetermined surface roughness to the elastic portion to improve durability of the contact pin when a load is repeatedly applied to the elastic portion of the contact pin, a contact portion formed at a tip of an end portion of the elastic portion and contacting the terminal of an electrical part, and an operation piece pressed by the cam portion of the operation member when the operation member moves toward the socket body, wherein the elastic portion is elastically deformed when the operation member moves toward the socket body and the operation piece of the contact pin is pressed by the cam portion of the operation member to separate the movable contact portion from the terminal of the electrical part.

19. The socket for an electrical part according to claim 18, wherein the socket is an IC socket having a plurality of contact pins and the electrical part is an IC package having a plurality of IC leads as terminals.

20. The socket according to claim 18, wherein the contact pin is formed from the metal material by punching out a predetermined shape from a thin metal plate.

21. The socket according to claim 18, wherein the predetermined surface roughness is achieved by removing an acute angle portion of a surface of the elastic portion.

22. The socket according to claim 18, wherein the surface roughness is less than about 1 $\mu$m.

23. The socket according to claim 18, wherein a nickel plating is applied to the polished elastic potion to increase thickness and elastic strength of the elastic portion.

24. The socket according to claim 23, wherein a gold plating is applied to the polished elastic portion after application of the nickel plating.

* * * * *

UNITED STATES PATENT AND TRADEMARK OFFICE
CERTIFICATE OF CORRECTION

PATENT NO. : 6,811,420 B2
DATED : November 2, 2004
INVENTOR(S) : Akira Miura

It is certified that error appears in the above-identified patent and that said Letters Patent is hereby corrected as shown below:

Column 8,
Lines 2 and 46, change "potion" to -- portion --.

Signed and Sealed this

Fifth Day of April, 2005

JON W. DUDAS
*Director of the United States Patent and Trademark Office*